United States Patent [19]

Thoma

[11] 4,413,329
[45] Nov. 1, 1983

[54] DYNAMIC MEMORY CELL

[75] Inventor: Endre P. Thoma, Colchester, Vt.

[73] Assignee: International Business Machines Corporation, Armonk, N.Y.

[21] Appl. No.: 419,095

[22] Filed: Sep. 16, 1982

Related U.S. Application Data

[63] Continuation of Ser. No. 219,697, Dec. 24, 1980, abandoned.

[51] Int. Cl.³ .................... G11C 11/24; G11C 11/40; G11C 7/00
[52] U.S. Cl. ................................ 365/189; 307/238.3; 365/222
[58] Field of Search .............. 365/174, 182, 189, 222, 365/202, 203, 205; 320/1; 307/449, 463, 238.3

[56] References Cited

U.S. PATENT DOCUMENTS

| | | | |
|---|---|---|---|
| 3,387,286 | 6/1968 | Dennard | 340/173 |
| 3,949,382 | 4/1976 | Yasui | 340/173 R |
| 4,061,954 | 12/1977 | Proebsting | 320/1 |
| 4,136,292 | 1/1979 | Suzuki | 307/355 |
| 4,162,416 | 7/1979 | Beecham | 307/362 |
| 4,203,159 | 5/1980 | Wanlass | 365/222 |
| 4,292,677 | 9/1981 | Bell | 365/189 X |
| 4,351,034 | 9/1982 | Eaton, Jr. et al. | 365/189 |

OTHER PUBLICATIONS

L. M. Arzubi, *IBM Technical Disclosure Bulletin*, Aug. 1975, vol. 18, No. 3, pp. 649 & 650, "Two-Device Storage Cell".

L. M. Arzubi, *IBM Technical Disclosure Bulletin*, Jul. 1976, vol. 19, No. 2, pp. 407 & 408, "Sense Amplifier for Capacitive Storage".

*Primary Examiner*—Robert L. Richardson
*Attorney, Agent, or Firm*—William N. Hogg; Theodore E. Galanthay

[57] ABSTRACT

A dynamic memory cell is disclosed which provides means for rewriting the cell after reading without discharging the bit line driver to thereby improve cycle time. The cell includes an independently operated device to access the capacitive storage node to discharge the node of any charge thereon after the reading of a low or no charge bit on the capacitive storage node.

9 Claims, 2 Drawing Figures

DYNAMIC MEMORY CELL

This application is a continuation of application Ser. No. 219,697, filed Dec. 24, 1980 and now abandoned.

BACKGROUND OF THE INVENTION

This invention relates generally to dynamic memory cells, and more particularly, to an improved one device memory cell wherein information is stored as a charge on a capacitive node and read by a reading device such as a field effect transistor (FET) being selectively switched on for reading the presence or absence of the charge at the capacitive node.

In the prior art, a one device dynamic memory cell with a capacitive node is connected through the cell device to a bit line which is charged to a very precise voltage. The bit line, in turn, is connected to a differential sense amplifier which, when the cell device is switched on will sense the presence or absence of a charge at the capacitive node. When the presence of a full charge is sensed, the voltage in the bit line maintains the charge at the capacitive node at essentially its full charge level thus causing the cell charge to be rewritten essentially as it is being read.

However, if a low charge is read at the capacitive node when the cell device is turned on, the voltage on this bit line will charge the capacitive node to essentially the full charge. Hence, to rewrite the low charge, the capacitive node has to be discharged.

According to the prior art technique, the discharging is accomplished by lowering the voltage in the bit line and turning on the cell device to allow the capacitive node to discharge. However, this has the serious disadvantage of significantly extending the cycle time, since a delay is encountered in bringing the bit line to a low voltage and then raising the bit line voltage to the high voltage.

SUMMARY OF THE INVENTION

According to the present invention an improved dynamic memory cell is provided wherein the high charge on the capacitive node on a cell is rewritten by the bit line as it is read, but a low charge is rewritten by a separately operated device responsive to the sensing of the low charge, whereby the bit line does not have to be driven to low voltage and then raised to high voltage after reading a low charge on the capacitive node.

DESCRIPTION OF THE PREFERRED EMBODIMENT

Figure 1:
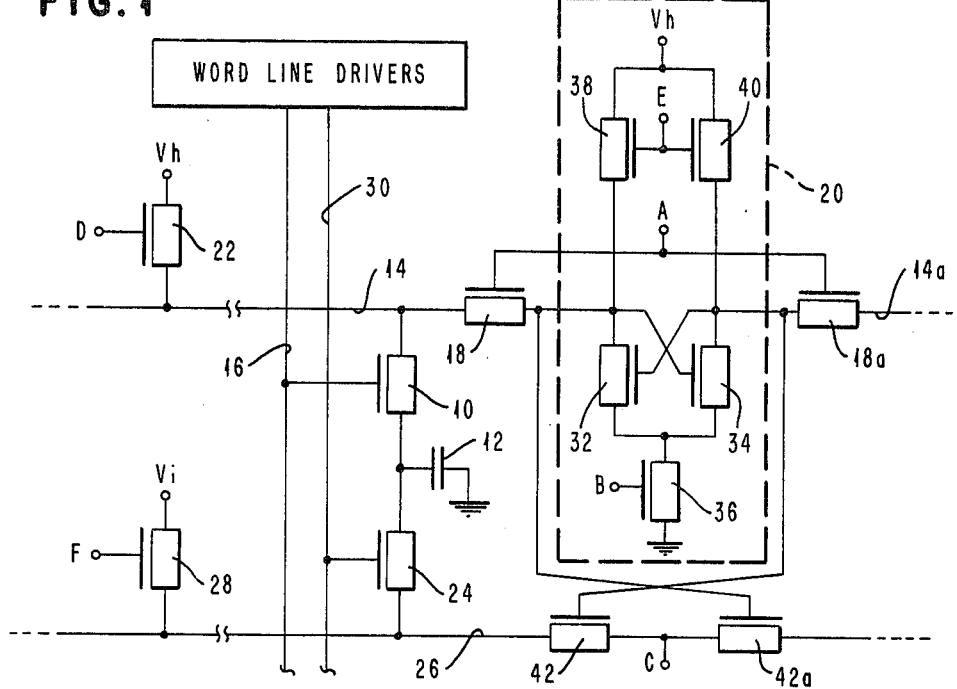
FIG. 1 is a circuit diagram of the improved memory cell and associated circuitry of the present invention.

Referring now to the drawing, and for the present to FIG. 1, the preferred embodiment of the present invention is shown. In the invention, a conventional so called one device cell is provided which includes a cell device 10 connected at one end to a capacitive storage node 12. (The cell device, and all of the other devices referred to hereinafter are field effect transistors (FET's) in this the preferred embodiment.) The opposite end of the cell device 10 is connected to a bit line 14 and the gate of the device 10 is connected to a first word line 16. The bit line 14 is connected through an isolation device 18 to a differential sense amplifier 20. The bit line is also connected to a bit line restore device 22 which is connected to a source of high voltage Vh.

The capacitive note 12 is also connected to one end of a cell write device 24, the opposite end of which is connected to a write line 26. The write line 26 is connected to a write line restore device 28 which is connected to an intermediate voltage Vi. The gate of the write line restore device 28 is connected to a second word line 30.

Only a single cell has been shown, however, in a memory array there are many other cells on the left side similarly connected to the bit line and word line to provide a memory array. Also, there are similar cells connected to complementary word lines and bit lines 14a on the opposite or right side of the sense amplifier 20 as is well known in the art. The bit line on the opposite side of the sense amplifier 20 is connected thereto through a second isolation device 18a. Further, there are reference cells (not shown) on each side to establish and maintain a precise bit line voltage as is well known in the art.

The differential sense amplifier 20 includes a pair of cross-coupled, latch devices 32 and 34 commonly connected at one end of each to set device 36. A restore device comprised of a pair of latch restore devices 38 and 40 each having one end commonly connected to the source of high voltage Vh with the opposite ends each connected to one end of one of the latch devices 32 and 34 is provided.

The bit line 14 on the sense amplifier side of the isolation device 18 is connected to write device 42a and the opposite side bit ine 14a on the sense amplifier side of an isolation device 18a is connected to a second write device 42.

Figure 2:
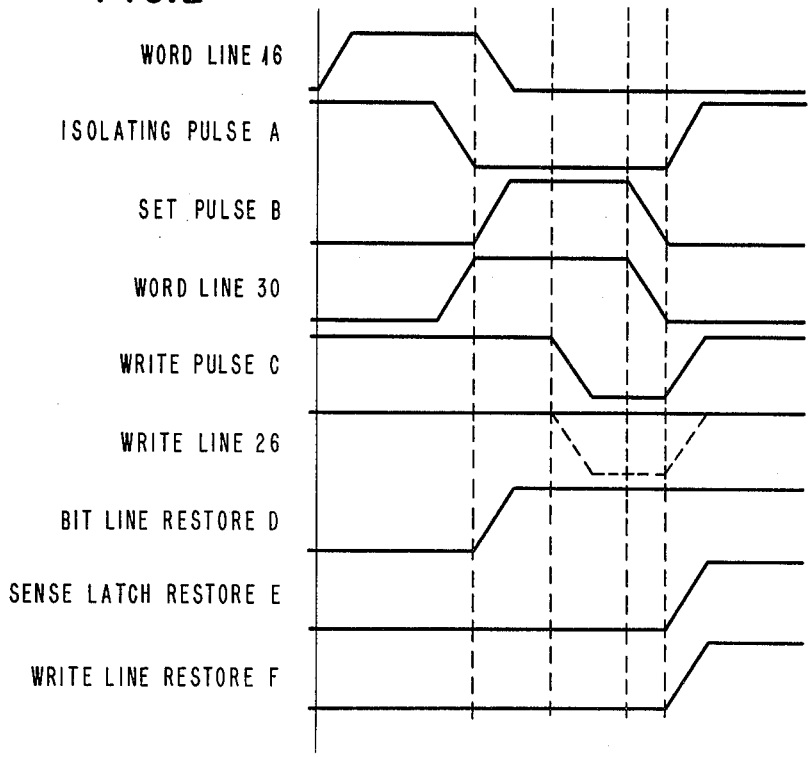
FIG. 2 is a pulse and voltage diagram of the operation of the circuitry of FIG. 1.

The operation of the memory can best be understood by reference to the pulse and voltage diagram in FIG. 2 in conjunction with the circuit shown in FIG. 1. The bit lines 14 and 14a are maintained at a constant high voltage, e.g., 5-8 volts. Word line 16 is normally maintained at low voltage. The isolating pulse applied from A to the gates of the isolating devices 18 and 18a normally maintains these devices on. The set pulse B applied to the gate of set device 36 is normally low maintaining this device off. Word line 30 is normally low and the write pulse C is normally maintained at intermediate voltage, e.g., 2-5 volts. The write line 26 is maintained at an intermediate voltage, e.g., 2-5 volts. The bit line restore pulse D applied to the gate of bit line restore device 22 is normally high. The sense latch restore pulse E applied to the gates of devices 38 and 40 and write line restore pulse F applied to the gate of write restore line device 28 are both normally high. The bit line restore pulse D, sense latch restore pulse E and write line restore pulse F all are pulsed low when a memory cycle begins.

In operation, to read the charge stored in capacitive node 12, word line 16 is pulsed which will turn on cell device 10. If a charge condition is existing at the capacitive node 12 the voltage of the bit line 14 will remain unchanged. Bit line 14a will be discharged by a reference circuit to permit a small signal difference to be applied to the gates of devices 32 and 34. (The difference is set by the reference circuit to approximately one half the normal signal magnitude due to a low charge stored in capacitive node 12.) Since isolation devices 18 and 18a are on, this will lower the voltage slightly at the gate of device 32 leaving device 34 on and device 32 off.

Immediately after word line 16 has been pulsed and the charge in capacitive node 12 is sensed by the bit line 14, the isolating pulse A on the gates of the device 18 and 18a is dropped turning off the devices 18 and 18a, thus isolating the word lines 14 and 14a from the sense amplifier 20. At the same time set pulse B is applied to the gate of device 36 setting the devices 32 and 34 in the condition to which they were driven, 34 having been on and 32 having been off. This will turn off device 42 isolating write line 26 from pulse source C.

When the node 12 is charged and the device 10 is turned on to read the node, the bit line 14 being at a high regulated voltage will maintain essentially the same value as prior to device 10 turning on thus rewriting the bit in the capacitive node 12 essentially as it is read. (Some charge may have to be replaced due to leakage on capacitive node 12.)

Referring again to the pulse diagram, after the set pulse is applied and the isolating pulse restored to isolate the sense amplifier from the bit line, the word line pulse is applied to the word line 30. The amplitude of the word line 30 pulse is low enough so that write device 24 remains off if write line 26 remains at its value of intermediate voltage. After word line 30 is pulsed, write pulse C is allowed to drop. But since write device 42 is off, the capacitive node cannot discharge and remains charged. Thus, write line 26 remains at its intermediate voltage state as shown by the solid line on the word line pulse diagram. Thus, the charge stays on the capacitive node 12.

With respect to restoring, the bit line restore pulse D applied to the gate of bit line restore device 22 can be applied any time after the isolating pulse has turned off device 18 and, hence, restoration of the bit line can start very early in the cycle. The sense latch restore pulse E applied to the gates of sense latch restore devices 38 and 40 and write line restore pulse F applied to the gate of write line restore device 28 can be applied after the write pulse C, word line pulse and set pulse B having been removed.

Returning again to the circuitry, if when the word line 16 is pulsed to turn on cell device 10, and there is low or no charge at capacitive node 12, the voltage in bit line 14 will drop with respect to the voltage in bit line 14a which will cause the latch device 32 to remain on and latch device 34 to turn off. As was indicated above, bit line 14a is discharged by the reference circuit as in the previous explanation. Also, when the cell device 10 is turned on the capacitive node will be raised to its charged state by bit line 14 at high voltage. The pulse program will be as previously described. When the latch sets, device 42 will remain on and device 42a will be turned off. However, when the write pulse C goes low, or to ground, since device 42 is on and 24 will be turned on, the write line will go low as shown in dotted lines and the capacitive node 12 will discharge thereby writing back into the node the original low charge which was sensed. Yet, even while the low charge is being rewritten into the capacitive node, the bit line is being restored since it is isolated both from the capacitive node 12 by off device 10 and from the sense amplifier 20 by off device 18. Further, there was only a small drop in the line voltage of bit line 14 and the line can be quickly and easily restored to the full voltage ready for the next cycle.

Hence, as indicated above, there is a greatly reduced cycle time for reading and rewriting a bit in a cell by virtue of providing a separate write line to rewrite low charge, and by allowing the bit line restore to start early in the cycle and require only a small rise in voltage to restore the bit line voltage.

What is claimed is:

1. In a memory system comprising a plurality of dynamic memory cells, and wherein each cell comprises a switchable cell device and a capacitive node, and wherein said switchable cell device is connected to a bit line to read the charge stored at said node and to a first word line to selectively switch said cell device responsive to a first signal in said word line, and
   wherein the system includes a sense amplifier to sense the read charge on said bit line, the improvement which comprises,
   a cell write device, said cell write device being connected to a write line and to said storage node and also connected to a second word line to selectively switch said cell write device responsive to a second signal in said second word line,
   and means to selectively connect said write line to a low voltage value responsive to a sensed low charge at said capacitive node,
   whereby a sensed low charge in said cell is rewritten independently of said bit line and a high charge in said cell is rewritten by said bit line upon reading.

2. The invention as defined in claim 1 wherein said means to selectively connect said write line to low voltage includes a second device connected in series with said cell write device, and means to selectively turn both devices on at the same time to discharge said node.

3. The invention as defined in claim 2 wherein said second device is operable by said sense amplifier sensing a low voltage.

4. The invention as defined in claim 3 wherein the cell write device is pulsed subsequently to a reading of a node.

5. The invention as defined in claim 1 further characterized by isolation means connected to isolate the sense amplifier from said cell after the capacitive node charge has been sensed.

6. The invention as defined in claim 5 wherein said isolation means includes a series connected device.

7. The invention as defined in claim 6 wherein said series connected device is normally on and means to switch said device off after the capacitive charge is sensed by said sense amplifier.

8. The invention as defined in claim 1 wherein said devices are field effect transistors.

9. In a memory system comprising a plurality of dynamic memory cells, and wherein each cell comprises a selectable cell device and a capacitive node, and wherein said cell device is connected to a bit line to read the charge stored at said node and to a first word line to selectively select said cell device responsive to a first signal in said word line, and
   wherein the system includes a sense amplifier to sense the read charge on said bit line, the improvement which comprises,
   cell write means independent of said bit line, said cell write means being connected between a write line and said storage node,
   and means to selectively connect said write line to a predetermined voltage value responsive to a sensed low charge at said capacitive node,
   whereby a sensed low charge in said cell is rewritten independently of said bit line and a high charge in said cell is rewritten by said bit line upon reading.

* * * * *